US009528180B2

(12) United States Patent
Becker et al.

(10) Patent No.: US 9,528,180 B2
(45) Date of Patent: Dec. 27, 2016

(54) SLIDING COMPONENT COATED WITH METAL-COMPRISING CARBON LAYER FOR IMPROVING WEAR AND FRICTION BEHAVIOR BY TRIBOLOGICAL APPLICATIONS UNDER LUBRICATED CONDITIONS

(75) Inventors: Jürgen Becker, Geisenheim (DE); Martin Grischke, Triesen (LI); Astrid Gies, Haldenstein (CH)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 14 days.

(21) Appl. No.: 14/002,412

(22) PCT Filed: Mar. 1, 2012

(86) PCT No.: PCT/EP2012/000893
§ 371 (c)(1),
(2), (4) Date: Jan. 2, 2014

(87) PCT Pub. No.: WO2012/116818
PCT Pub. Date: Sep. 7, 2012

(65) Prior Publication Data
US 2014/0128298 A1 May 8, 2014

Related U.S. Application Data

(60) Provisional application No. 61/448,334, filed on Mar. 2, 2011.

(51) Int. Cl.
*C23C 14/06* (2006.01)
*C23C 14/14* (2006.01)
(Continued)

(52) U.S. Cl.
CPC ............. *C23C 14/14* (2013.01); *C23C 14/021* (2013.01); *C23C 14/025* (2013.01);
(Continued)

(58) Field of Classification Search
USPC ........ 384/907; 428/408, 697, 698, 699, 704; 277/442
See application file for complete search history.

(56) References Cited

U.S. PATENT DOCUMENTS 4,525,417 A     6/1985   Dimigen et al.
5,266,409 A * 11/1993   Schmidt et al. ............. 428/698
(Continued)

FOREIGN PATENT DOCUMENTS

EP    0 087 836 A1    9/1983
EP    0 579 983 A1    1/1994
(Continued)

OTHER PUBLICATIONS

Dimigen, et al., "Tribological and Electrical Properties of Metal-containing Hydrogenated Carbon Films", Applied Physics Letters, AIP, American Institute of Physics, Melville, NY, US, vol. 50, No. 16, Apr. 20, 1987, pp. 1056-1058.
(Continued)

*Primary Examiner* — Archene Turner
(74) *Attorney, Agent, or Firm* — Pearne & Gordon LLP

(57) ABSTRACT

The present invention relates to a coating for sliding parts that allows using diamond like carbon (DLC) or DLC-comprising coatings in combination with Molybdenum- and/or Zinc-comprising lubricants in such a manner that enhanced reduction of wear and friction in comparison to the state of the art is attained. The coating system according to the present invention comprises at least a metal-comprising carbon layer of the type Me-C/a)-C:X, whose element composition can be expressed as $(Me_aC_{1-a})_{1-b}X_b$ with $0.3 \leq a \leq 0.6$ and $0 < b \leq 0.3$, where Me is a metal or a combination of different metals and X is an element different from Me and different from C or X is a mixture of elements different from Me and which doesn't contain C. Me can be preferably Chromium (Cr) or Molybdenum (Mo) and X can
(Continued)

Figure 1:
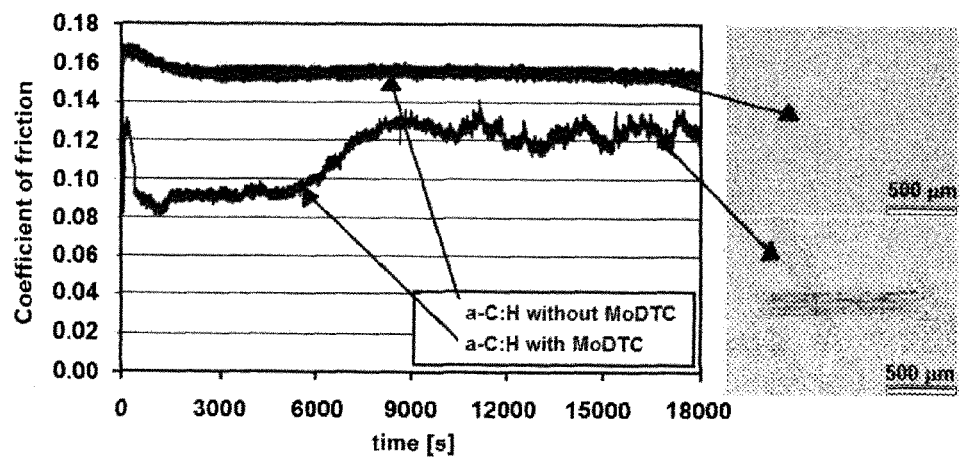

be preferably hydrogen (H) or a mixture of silicon and hydrogen (Si+H).

18 Claims, 12 Drawing Sheets

(51) Int. Cl.
      *C23C 14/02*       (2006.01)
      *C23C 14/35*       (2006.01)
      *C23C 14/50*       (2006.01)
      *F04B 1/14*       (2006.01)
      *F04B 1/20*       (2006.01)
      *F04B 27/08*       (2006.01)
      *F04B 27/10*       (2006.01)

(52) U.S. Cl.
      CPC ........ *C23C 14/027* (2013.01); *C23C 14/0605* (2013.01); *C23C 14/067* (2013.01); *C23C 14/0664* (2013.01); *C23C 14/0682* (2013.01); *C23C 14/0688* (2013.01); *C23C 14/352* (2013.01); *C23C 14/505* (2013.01); *F04B 1/146* (2013.01); *F04B 1/2078* (2013.01); *F04B 27/086* (2013.01); *F04B 27/109* (2013.01); *F05C 2201/0496* (2013.01); *F05C 2203/086* (2013.01); *F05C 2203/0808* (2013.01); *F05C 2251/14* (2013.01)

(56) References Cited

U.S. PATENT DOCUMENTS

| | | | | |
|---|---|---|---|---|
| 6,340,245 | B1 * | 1/2002 | Horton et al. ................ | 428/216 |
| 6,740,393 | B1 * | 5/2004 | Massler et al. ............... | 428/216 |
| 6,806,242 | B2 * | 10/2004 | Shirahama et al. ........... | 508/291 |
| 6,969,198 | B2 * | 11/2005 | Konishi et al. ............... | 384/297 |
| 7,146,956 | B2 * | 12/2006 | Nomura .................. | F01L 1/047 |
| | | | | 123/90.34 |
| 7,300,379 | B2 * | 11/2007 | Doll ........................ | F16C 33/16 |
| | | | | 475/220 |
| 7,498,083 | B2 * | 3/2009 | Yamamoto et al. ........... | 428/408 |
| 7,771,822 | B2 * | 8/2010 | Jabs et al. ..................... | 428/408 |
| 7,887,919 | B2 * | 2/2011 | Yamamoto ............. | C23C 14/022 |
| | | | | 428/408 |
| 7,951,756 | B2 * | 5/2011 | Konishi et al. ............... | 508/167 |
| 8,206,035 | B2 * | 6/2012 | Martin et al. ................. | 384/907 |
| 8,318,328 | B2 * | 11/2012 | Endrino et al. ............... | 428/697 |
| 8,496,382 | B2 * | 7/2013 | Evans et al. .................. | 384/907 |
| 8,846,590 | B2 * | 9/2014 | Castle ........................... | 508/363 |
| 8,895,488 | B2 * | 11/2014 | Komori ......................... | 508/108 |
| 9,090,965 | B2 * | 7/2015 | Sugimoto ............. | C23C 14/0605 |
| 2010/0247004 | A1 * | 9/2010 | Suzuki ....................... | F16J 9/26 |
| | | | | 384/13 |

FOREIGN PATENT DOCUMENTS

| | | | |
|---|---|---|---|
| JP | 2003-027214 | * | 1/2003 |
| JP | 2008-195903 | * | 8/2008 |
| JP | 2009-079138 | * | 4/2009 |
| JP | 2009-185336 | * | 8/2009 |
| WO | 01/79585 | A1 | 10/2001 |
| WO | 2006/005200 | A1 | 1/2006 |
| WO | 2006/005217 | A2 | 1/2006 |

OTHER PUBLICATIONS

International Search Report for PCT/EP2012/000893 dated May 18, 2012.

* cited by examiner

SLIDING COMPONENT COATED WITH METAL-COMPRISING CARBON LAYER FOR IMPROVING WEAR AND FRICTION BEHAVIOR BY TRIBOLOGICAL APPLICATIONS UNDER LUBRICATED CONDITIONS

The present invention relates to a coating for sliding parts that allows using diamond like carbon (DLC) or DLC-comprising coatings in combination with Molybdenum- and/or Zinc-comprising lubricants in such a manner that enhanced reduction of wear and friction in comparison to the state of the art is attained. The coating system according to the present invention comprises at least a metal-comprising carbon layer of the type Me-C/a-C:X, whose element composition can be expressed as $(Me_aC_{1-a})_{1-b}X_b$ with $0.3 \leq a \leq 0.6$ and $0 < b \leq 0.3$, where Me is a metal or a combination of different metals and X is an element different from Me and different from C or X is a mixture of elements different from Me and which doesn't contain C. Me can be preferably Chromium (Cr) or Molybdenum (Mo) and X can be preferably hydrogen (H) or a mixture of silicon and hydrogen (Si+H).

STATE OF THE ART

The application of DLC coatings is well established in the automotive industry as standard solution to eliminate wear problems in critical designs with a demand for very high load-bearing.

However, in spite of the excellent friction reduction properties of DLC coatings, it has been observed that by using some advanced oil additives in combination with DLC coatings not satisfactory results regarding friction reduction and wear performance in automotive systems can be obtained.

The friction reduction properties of DLC coatings, both under dry and lubricated conditions are well known but the topic "reduction of friction losses" becomes only recently more and more important because of the currently strong focus on fuel efficiency and minimization of $CO_2$ emissions.

DLC coatings of the types a-C:H (metal-free, hydrogen-comprising DLC) and a-C:H:Me (metal- and hydrogen-comprising DLC) according to the German guideline VDI 2840 are for example commonly used in the automotive industry and are well established as a standard solution to cope with wear problems in critical designs which involve in particular high loads, starved lubrication and potential seizure problems.

Metal containing a-C:H:Me coatings are mostly prepared by reactive d.c. magnetron sputtering in batch coaters or in multi chamber in-line machines as well. The used targets consist of metal or metal carbides and the working gas is a mixture of Argon- and a hydrocarbon gas, e.g. acetylene. Metal containing a-C:H:Me coatings exhibit commonly lower hardness and wear resistance than metal free a-C:H coatings but probably higher toughness. In most cases tungsten (W) or titanium (Ti) are used for the preparation of a-C:H:Me coatings with the intention of attaining good friction and/or wear reduction in tribological systems, but technically also other carbide forming metals could be used. For example, also a-C:H:Cr coatings have been produced by means of reactive magnetron sputtering deposition techniques, using low ions bombarding energies. It was observed that in these cases the a-C:H:Cr coatings grow as completely amorphous films.

The above mentioned DLC coatings of the type a-C:H:Me which are used for sliding applications are characterized by Me:C ratios in atomic percent of not more than 20%.

The friction reduction properties of DLC coatings are however in competition with other kind of solutions like new functional designs and technologies, but especially with developments in the field of improved oil additives.

In general most of the DLC coatings have been designed to work properly with or without lubrication but unfortunately, some of the currently used additives show poor compatibility with DLC coatings. This is exactly the case that has been observed by interactions of DLC coatings of the type a-C:H and a-C:H:Me with Molybdenum- and Zinc-comprising oil additives such as Molybdenum Dithio Carbamate (MoDTC) and Zinc Dialkyldithiophosphate (ZDDP). MoDTC is a friction modifier that is nowadays commonly used as additive in many engine oils in order to reduce friction. ZDDP is an anti-wear additive found in many types of hydraulic and lubricating fluids. MoDTC and ZDDP oil additives, particularly when they are applied in high concentrations, can influence the friction and/or wear behaviour of DLC coatings strongly turning it bad.

Furthermore, in general in relation to extreme pressure additives (EP additives) which are designed to reduce friction in the range of extreme mixed or border lubrication, the intended effect is based on the formation of surface layers containing sulfides and Mo-oxides. In these cases, the tribochemical reaction that generates the surface layer from the complex molecules of the additive is designed to work in the presence of one steel or at least one metal surface. Supposable for this reason, the expected tribochemical reactions between additive and surface does not take place when pure carbon surfaces or mostly carbon surfaces such as a-C:H and a-C:H:Me coatings are used and therefore the formation of the surface layers fails. Furthermore, it is also possible that unwanted chemical reactions between the complex molecules of the additives and the a-C:H or a-C:H:Me coating occur and it leads to a degeneration of the coating itself. Most likely it is the explanation because of that frequently a-C:H coatings which have a hardness greater than 20 GPa undergoes a continuous wear when they are used in combination with lubricants which contain EP additives instead of to exhibit the usual running-in performance with subsequent stable and wear-free friction behavior.

Moreover, it is known that the structure of coatings that comprise metals and carbon can be strongly influenced by the coating deposition conditions. For example, in some cases the use of increased ion energies by deposition of Cr—C coatings can lead to the appearance of some well-defined peaks in the X-ray diffraction patterns which could be assigned to the chromium carbides $Cr_7C_3$, $Cr_3C_2$ and fee CrC. In other cases, for example in ion plated Cr—C coatings metastable fcc CrC phase has been revealed as sub-stoichiometric.

Furthermore, sputter deposited Cr—C coatings having Cr-contents between 18 and 85 at % have been investigated regarding machining performance and they are known to exhibit good machining performance in different machining applications depending on the Cr-content. For example clearly lowest wear rates and best results in drilling tests have been observed by Cr—C coatings containing about 69 at % Cr while best performance in turning tests have been attained by Cr—C coatings containing about 18 at % Cr. It is also known that the coating thickness of $Cr_xC$-coated tools has a considerable influence on the machining performance.

Nevertheless, metal-containing DLC coatings have not been investigated until now regarding chemical properties when they are used in combination with lubricants and especially with lubricants containing Mo- and/or Zn-comprising additives.

OBJECTIVE OF THE PRESENT INVENTION

An objective of the present invention is to provide a solution for the above described problem. Furthermore is an objective of the present invention to provide a coating system for sliding parts that allows using DLC or DLC-comprising coatings in combination with lubricants which contain Mo- and/or Zn-comprising additives such as MoDTC and ZDDP without deterioration of the DLC or DLC-comprising coatings but resulting in enhanced reduction of wear and friction in comparison to the state of the art.

DESCRIPTION OF THE INVENTION

In order to overcome the drawbacks of DLC coatings in interaction with lubricants containing Mo- and/or Zn-comprising additives, the inventors aimed to design a new by metal-doping modified DLC coatings which can offer chemical affinity to the mentioned additives and consequently better friction and wear behavior in comparison to the state of the art.

As mentioned before a-C:H:Me coatings having not more than 20% in atomic ratio Me-C are known from the state of the art to be used for coating of sliding components in order to improve wear and friction behavior, however these coatings similarly like metal-free a-C:H coatings are not compatible with lubricants which contain Mo- and/or Zn-comprising additives.

The inventors found surprisingly that metal doped DLC coatings having a Me:C ratio in atomic percent greater than or equal to 30% and minor than or equal to 60% exhibit a positive interaction with lubricants which contain Mo- and/or Zn-comprising additives and consequently a considerably much better wear and friction behavior in comparison with conventional DLC coatings of the type a-C:H and a-C:H:Me.

In order to describe more precisely the modified structure of the new metal-doped DLC coatings for sliding applications produced according to the present invention, these coatings will be identified in the context of the present invention as following:

Me-C/a-C—X, where Me is one metal or a combination of two or more metals and X is an element different from Me and different from C or X is a mixture of elements different from Me which doesn't contain C, and the where the ratio Me:C in atomic percent is greater than 20%.

The ratio Me:C is in the context of the present invention always given in at-% and is calculated using the following formula:

Me:C [at %]=(Me [at %]/(Me [at %]+C [at %]))*100

Accordingly in the context of the present invention Me-comprising DLC coatings containing hydrogen and having a Me:C ratio not greater than 20% will be following only referred to as a-C:H:Me coatings, while Me-comprising DLC coatings having a Me:C ratio greater than 20% will be following only referred to as Me-C/a-C:X.

The inventors compared the wear mechanism of Me-C/a-C:X coatings used in combination with Molybdenum- and/or Zinc-comprising lubricants according to the present invention and compared it with the wear mechanism of a-C:H and a-C:H:Me coatings.

The Me-C/a-C:X coatings synthesized according to the present invention allowed not only to attain reduced surface wear but to utilize the benefits of the additive-induced friction reduction.

In particular the inventors found that a very positive interaction with Molybdenum- and Zinc-comprising lubricants (e.g. MoDTC- and ZDDP-comprising lubricants) regarding reduction of wear and friction by tribological applications can be attained when Me is essentially Chromium (Cr) and X is essentially hydrogen (H) or X is a mixture of hydrogen and silicon (H+Si).

FIGURE CAPTIONS

FIG. 1: Results of a DLC coatings of the type a-C:H tested in a lubricated (MoDTC-free and MoDTC-containing oil) oscillating wear test.

Figure 2:
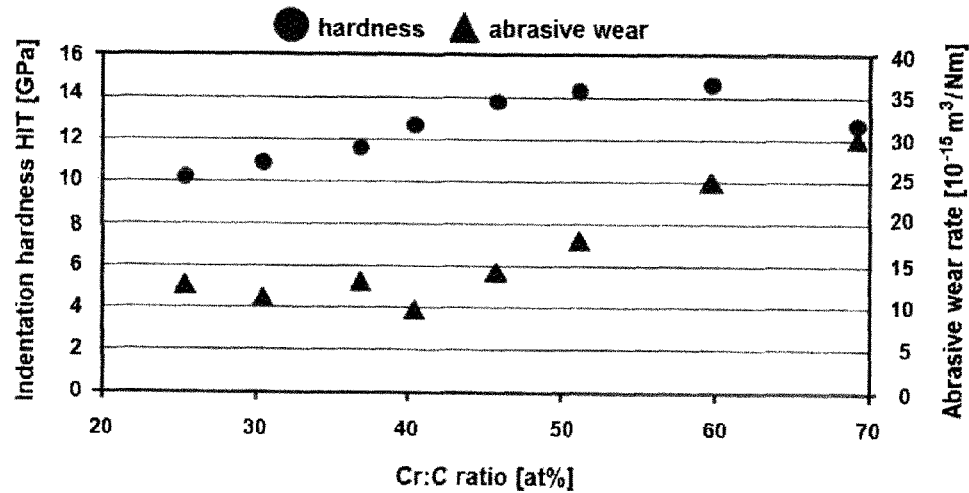

FIG. 2: Indentation hardness $H_{IT}$ and abrasive wear rates of the Cr—C/a-C:H coatings in dependence from coating composition FIG. 3: Cross sectional SEM images of the Cr—C/a-C:H coatings having different Cr:C ratios; a) Cr:C ratio ca. 25% ($H_{IT}$=10.2 GPa, EIT=114 GPa), b) Cr:C ratio ca. 50% ($H_{IT}$=14.3 GPa, EIT=197 GPa), c) Cr:C ratio ca. 70% ($H_{IT}$=12.7 GPa, EIT=205 GPa), d) Cr:C ratio ca. 50% but produced by different deposition parameters ($H_{IT}$=21.3 GPa, EIT=225 GPa)

FIG. 4: Ball-on-disc tests friction curves of Cr—C/a-C:H coatings having different Cr:C ratios and tested under lubrication with a standard engine oil a) without MoDTC, b) with MoDTC FIG. 5: Friction coefficient and averaged wear track depth of Cr—C/a-C:H coatings with different Cr:C ratios after oil lubricated ball-on-disc tests; a) oil without MoDTC; b) oil with MoDTC FIG. 6: Wear track profiles of Cr—C/a-C:H coatings having different Cr:C ratios and a-C:H coatings after oil lubricated ball-on-disc tests derived from laser microscope investigation (Y-axis full scale: 15 μm).

Figure 7A:
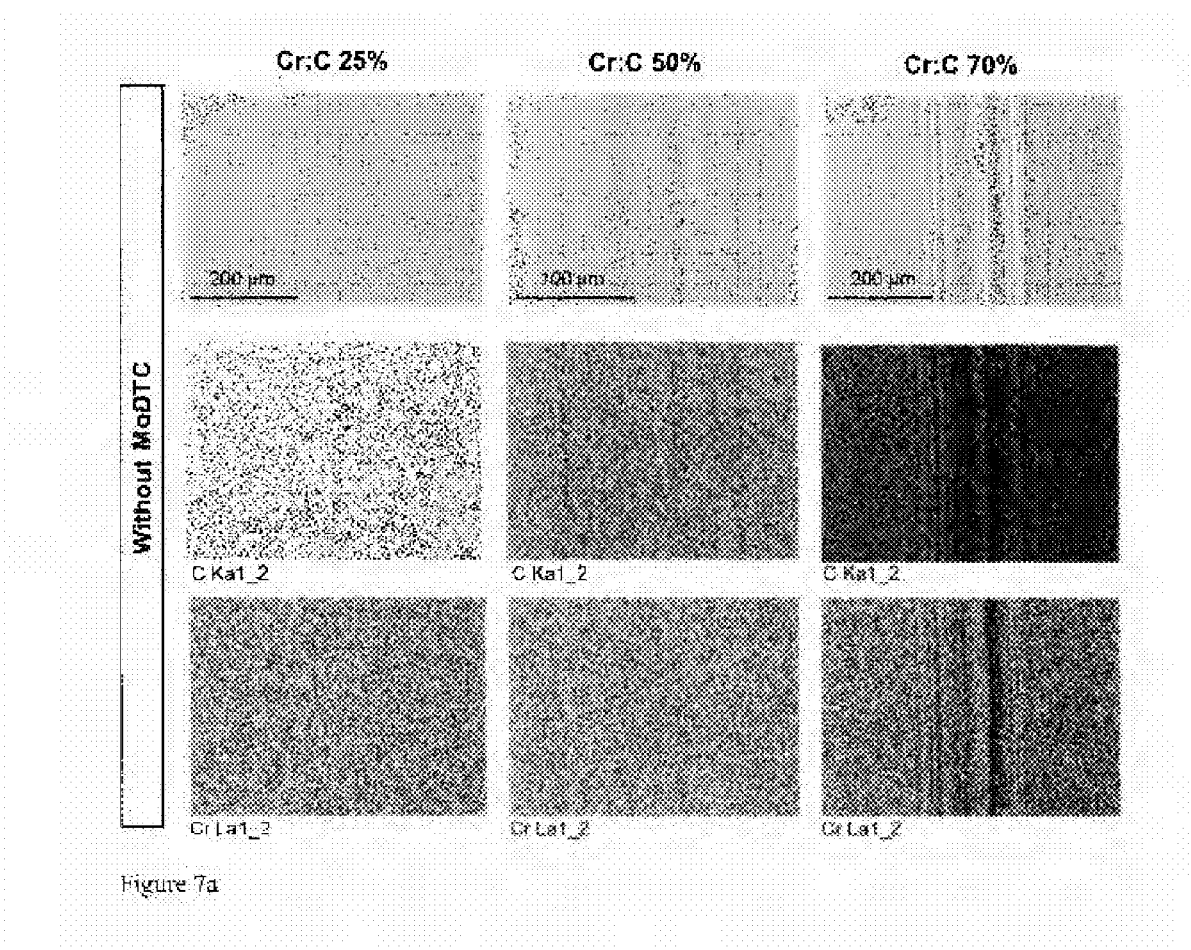
Figure 7B:
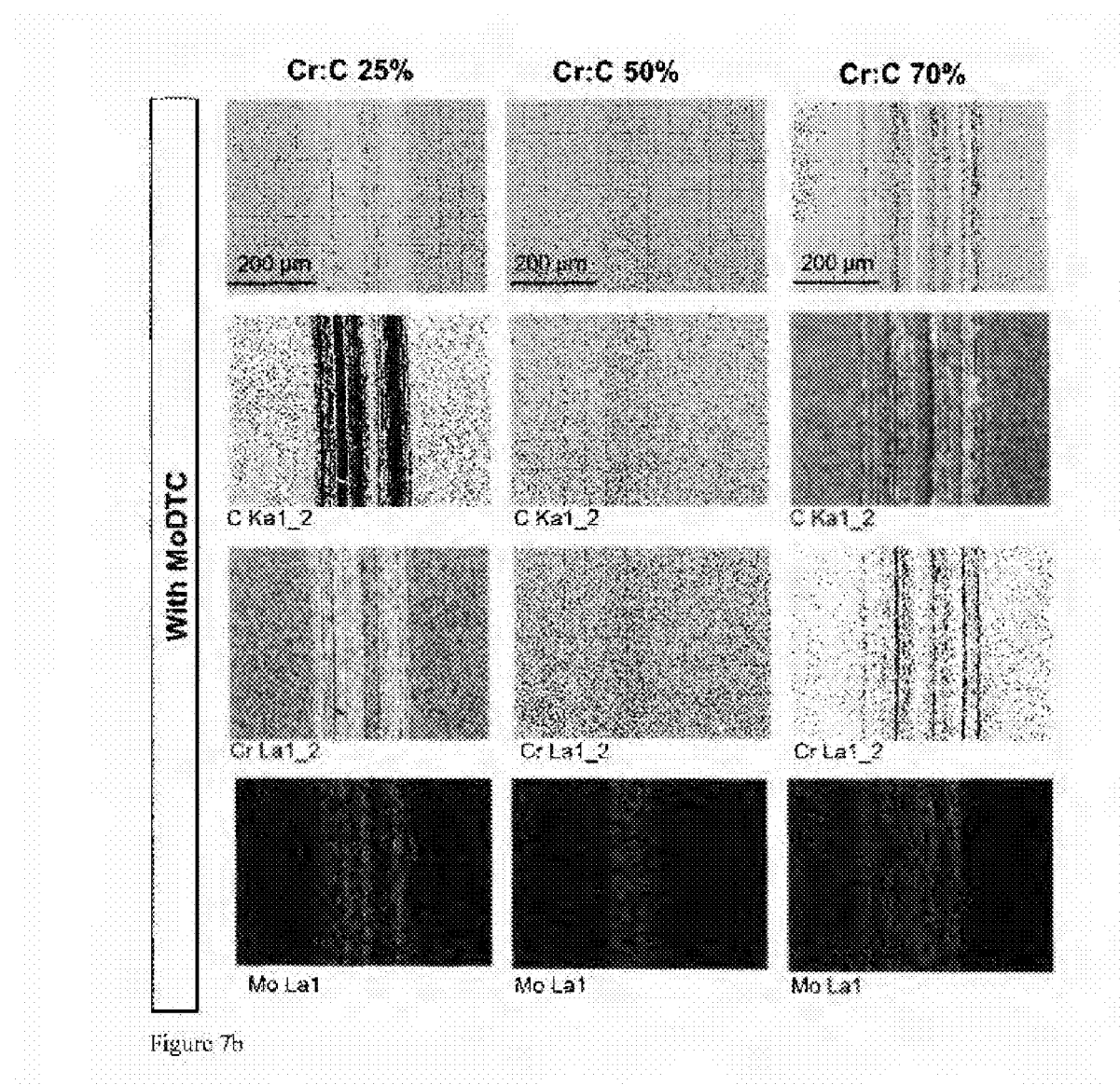

FIG. 7: SEM images and EDX element mappings of wear tracks of the three different Cr—C/a-C:H coatings having respectively Cr:C ratios of approximately 25%, 50% and 70% after oil lubricated ball-on-disc tests a) oil without MoDTC: 1.-3. line: SEM image, EDX: C, EDX: Cr; b) oil with MoDTC: 1.-4. line: SEM image, EDX: C, EDX: Cr, EDX: Mo FIG. 8: SEM images and EDX element mappings of wear tracks of a-C:H coatings after oil lubricated ball-on-disc tests. 1.-4. line: SEM images, EDX: C, EDX: Cr, EDX: Mo; left: without MoDTC, right: with MoDTC FIG. 9: SEM cross section images of wear tracks of different Cr—C/a-C:H coatings after lubricated ball-on-disc tests under oil with MoDTC a) Cr:C ratio ca. 25%; b) Cr:C ratio ca. 50%; c) Cr:C ratio ca. 70%

Figure 10:
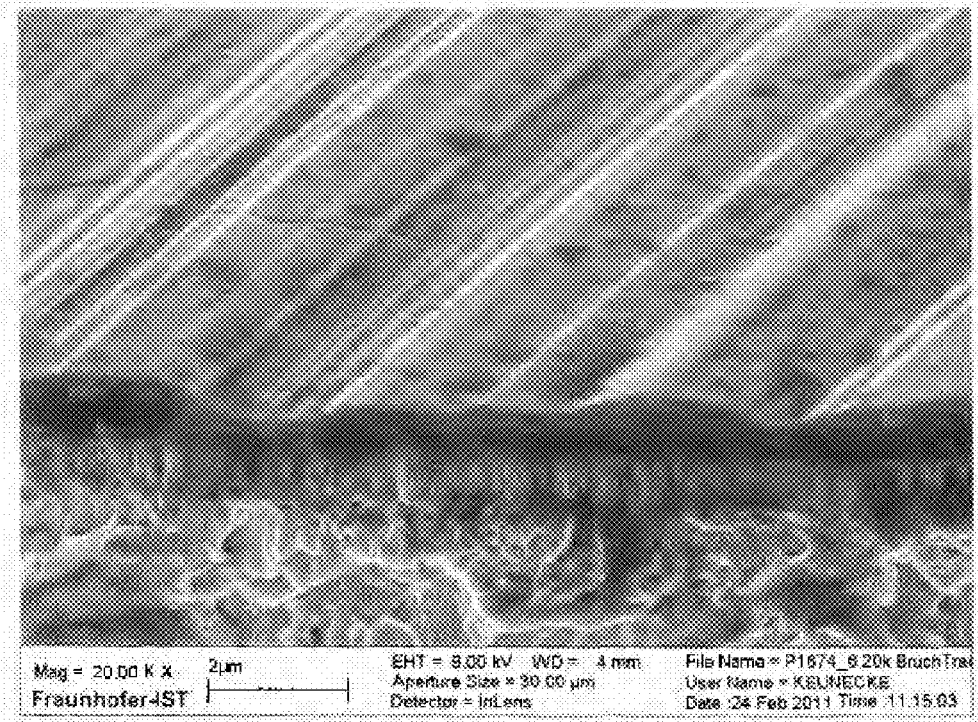

FIG. 10: SEM cross section images of wear tracks of a-C:H coating after lubricated ball-on-disc tests under oil with MoDTC FIG. 11: SIMS measurements of hydrogen content of Cr—C/a-C:H coatings deposited by different Cr:C ratios FIG. 12: Draft of a coating system containing a function layer of the type Me-C/a-C:H according to the present invention.

EXAMPLES OF THE INVENTION

Initial tests indicated that MoDTC in high concentrations is strongly interfering with DLC coatings of the type a-C:H and a-C:H:Cr which can negatively affect the wear resistance of these kinds of coatings.

The inventors tested in a lubricated oscillating wear test a-C:H coatings and compared the influence of MoDTC-containing oils with the influence of MoDTC-free standard oils on the wear and friction performance of this kind of DLC coatings. The results are shown in FIG. 1. As it can be observed if FIG. 1, the wear resistance of a-C:H coatings decreases considerably using MoDTC-containing lubricants and hence the reduction of friction induced by using a-C:H coatings is limited. Even if the coefficient of friction is slightly reduced by the MoDTC-containing oil, the DLC coating undergoes a more pronounced wear which can be seen in the wear track investigated by optical microscopy (FIG. 1, on the right side). Furthermore it can be observed that the initially low friction coefficient with MoDTC-containing oil starts to increase again with the ongoing wear track.

Further the present invention will be explained in more detail using some examples of Cr—C/a-C:H coatings and Cr—C/a-C:X coatings with X=H+Si which were additionally analysed regarding coating properties and tribological behaviour in combination with Mo- and/or Zn-comprising lubricants.

For producing the Cr—C/a-C:H coatings and Cr—C/a-C:X coatings with X=H+Si according to the present invention, the inventors used basically sputter techniques for adding Cr in the carbon-containing coating which were produced simultaneously in the coating chamber by means of plasma assisted chemical vapor deposition (PACVD) techniques. However, other known physical vapor deposition techniques such as arc ion platting (AIP) or combinations of sputter and arc processes or arc and PACVD processes or processes including the activation of additional ionization sources during coating deposition could also be used for producing the coatings according to the present invention.

The Cr—C/a-C:H coatings and Cr—C/a-C:X coatings with X=H+Si synthetized according to the present invention offer the necessary active surface chemistry in order to attain a positive interaction with the additives contained in the lubricants and consequently to build up the necessary surface layer.

These coatings produced according to the present invention were deposited having different Cr:C ratios and investigated regarding morphology, functionality and tribological properties will be described following in more detail.

The inventors found that variations of the Cr:C ratio have a significantly influence on the morphology of these coatings and thereby the tribochemical interaction of these coatings with Mo- and/or Zn-comprising oil additives, particularly with MoDTC additives in engine oils, can be strongly influenced in a positive way.

Also the coating deposition parameters can influence the morphology and in general other coating properties of these coatings.

Example 1

Cr—C/a-C:H Coatings in Interaction with MoDTC-Comprising Lubricants

Coating Deposition: The Cr—C/a-C:H coatings with different Cr:C ratios were prepared in a commercial PVD/PACVD-system (Oerlikon Balzers BAI830DLC) with a residual pressure in the range of $2.0 \cdot 10^{-5}$ mbar or below. The coating chamber has a volume of approximately 1 m³ and is equipped with two magnetron sources. The substrates can be coated in 2-fold-rotation and 3-fold rotation; in the present case 2-fold rotation was used.

Prior to deposition, the steel substrates (DIN 1.2842, Ø 22 mm×5.6 mm) were heated to approximately 150° C. and etched in a pure Ar plasma with ions extracted from an additional arc discharge (low voltage arc). After etching, a pure Cr layer (adhesion layer 3) was deposited by means of dc-sputtering from two Cr-targets in a pure Ar atmosphere in order to assure a good adherence between the following coating and the steel substrate. In addition, prior to the Cr—C/a-C:H coating (function layer 1) a $Cr_xN_y$ layer (support layer 5) was deposited from two Cr-targets in a mixed $Ar/N_2$ atmosphere in order to increase the load capacity for the following Cr—C/a-C:H coating (function layer).

In some cases also a gradient layer comprising essentially Cr—N—C (transition layer 7) and having variable nitrogen and carbon content along its thickness was deposited between the Cr—N and the Cr—C/a-C:H layer by simultaneously reducing of the nitrogen flow and increasing of the $C_2H_2$-flow in the coating chamber in order to increase the bonding strength within the coating system.

The Cr—C/a-C:H coatings were then deposited by means of dc-sputtering from two Cr-targets in a mixed $Ar/C_2H_2$ atmosphere in a pressure range of $4.0\text{-}4.5 \cdot 10^{-3}$ mbar. During deposition, the target power was kept constant at 7.5 kW per target, the bias voltage (applied with a d.c. pulse power supply) was adjusted to −800 V and the Ar flow was set to 115 sccm. The Cr:C-ratio was then adjusted by simply varying the $C_2H_2$ flow between 142 sccm (for the lowest Cr content) and 57 sccm (for the highest Cr content). The coating thickness was commonly adjusted to about 2 μM and the process temperature was below 230° C.

The Cr:C ratio in the Cr—C/a-C:H coatings varies nearly linearly with the $C_2H_2$ flow. For the investigated $C_2H_2$-range, the Cr content was adjusted between ~25% (for the highest $C_2H_2$ flow) and ~70% (for the lowest $C_2H_2$ flow).

In some cases after the deposition of the Cr—C/a-C:H coating (function layer 1) a further layer or top layer having run-in properties (run-in layer 9) was deposited.

The run in layer 9 is preferably a Cr—C/a-C:H layer having a Cr:C ratio of 25% or a standard a-C:H layer having run-in properties.

For comparison, the same steel samples were also coated with commercially available, metal-free DLC coatings (a-C:H coatings) with a coating thickness of about 2-3 μm. The a-C:H coating was performed in a m.f. glow discharge process in a mixed $Ar/C_2H_2$ atmosphere with an approximately 0.5 μm thick sputtered Cr layer as adhesion layer.

Coating Characterization:

The composition of the coatings was determined by electron probe microanalysis (EPMA, Cameca SX 100). Furthermore the morphology of the coatings was characterized by scanning electron microscopy (SEM, Leo 1530, Leo Electron Microscopy). Cross section images were taken under an angle of 60°. Coating hardness (Indentation Hardness $H_{IT}$) and elastic indentation modulus (EIT) were determined with a commercial instrument (Fischerscope H 100) recording load vs. indentation depth curves up to 30 mN. The maximum indentation depth ranged up to 300 nm. Abrasive wear rates were determined with the ball cratering test operating with an alumina suspension (mean alumina grain size 1 μm). To quantify the results, the volume of the crater ground into the coating had been divided by the normal load and the track length of the rotating ball. The unit used for abrasive wear rate $w_v$ of the coatings was $10^{-15}$ m³N⁻¹ m⁻¹.

In order to analyze the tribological properties (coefficient of friction and wear behavior) of the different Cr—C/a-C:H coatings, ball-on-disc-tests have been carried out. We used a Cr—C/a-C:H-coated disc which was rotating with a linear speed of 0.1 m/s under a stationary and uncoated spherical pin (ball with Ø 3 mm, 100Cr6, hardened to 64) on which a normal load of 30 N was applied. The test was carried out for a sliding distance of 2000 m. In order to analyze the friction and wear behavior of Cr—C/a-C:H coatings with different Cr:C ratios in the presence of MoDTC, the ball-on-disc-tests were carried out under lubricated conditions using two different oils. Both oils were fully formulated. In addition, one of the two oils contained MoDTC. The Hertzian contact stress in the beginning of the tests was about 2.0 GPa and dropped down to a surface pressure of approximately 0.3 GPa at the end of the test, due to the progressive wear of the uncoated steel ball.

The analysis of the wear tracks was carried out with different techniques. The profile shape of the wear track was determined by a commercial confocal laser microscope (Olympus Lext OLS 3000). The averaged wear track depth was measured with a stylus profiler (Dektak 3, Veeco) with a diamond tip radius of 12.5 µm. Additionally, the topography, the coating morphology and the surface elemental distribution in the wear tracks and surface layer were determined by SEM (plane and cross section) and EDX (Oxford X-max) mapping of different elements (C, Cr, Mo).

Mechanical Properties and Coating Morphology:

First of all it's worth to mention, that the deposition process for the here presented Cr:C coatings is stable and the coating composition as well as the mechanical and tribological properties are reproducible.

FIG. 2 gives the mechanical properties (indentation hardness $H_{IT}$ and abrasive wear rates) of the Cr—C/a-C:H coatings in dependence from the coating composition. The indentation hardness of the coatings increases up to a Cr:C ratio of approximately 50%, the hardness seems to remain constant up to a Cr:C ratio of approximately 60% and to decrease for higher Cr:C ratios. The abrasive wear rates (determined with ball cratering test) are nearly constant up to a Cr:C ratio of approximately 45%. A further rise of the Cr content leads to higher wear rates.

The exact slope of the dependency and of the characteristic hardness maximum depend on the used metal respectively the metal carbides and the process parameters.

Coatings having a Cr:C ratios smaller than 25 at % were not investigated in detail, because of the expected metal-free DLC like interaction (negative interaction) with Mo- and Zn-comprising oil additives as well as the expected disadvantageous combination of low coating hardness and increased wear rate as a result of the very low metal content.

The hardness and the abrasive wear resistance of the investigated Cr—C/a-C:H coatings was lower compared to DLC-coatings of the type a-C:H as expected. Due to the wide industrial use of DLC coatings as high performance wear resistant and friction reducing coatings, a DLC coating of the type a-C:H was used as reference. An indentation hardness of more than 20 GPa (in the present case measured at 24.8 GPa) and abrasive wear rates of less than $1*10^{-15}$ m$^3$/Nm (here $0.6*10^{-15}$ m$^3$/Nm) confirm the outstanding mechanical properties of these coatings.

Figure 3A:
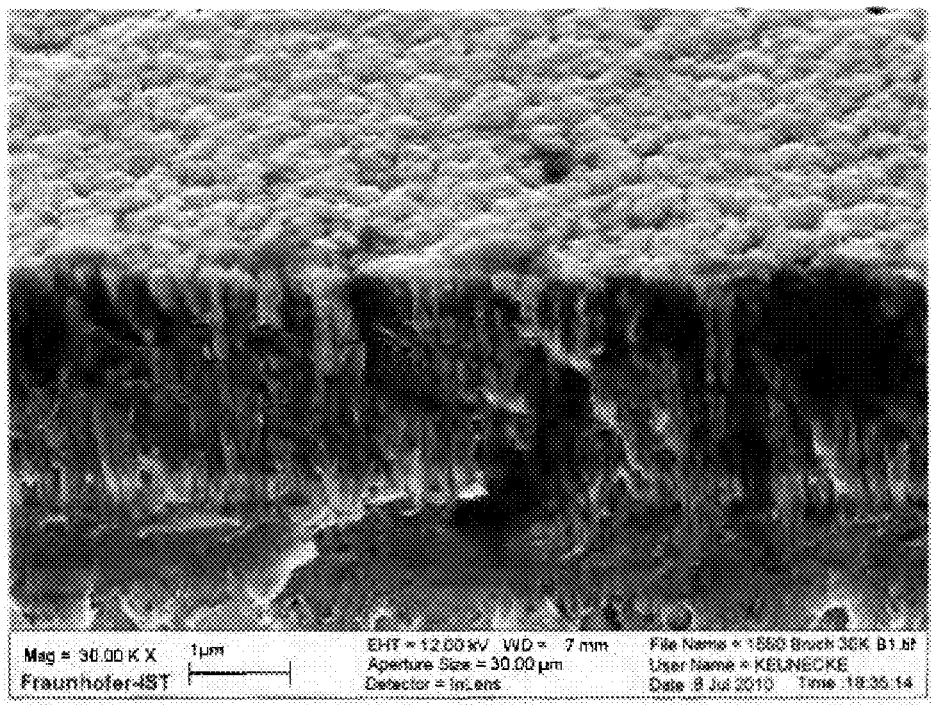
Figure 3B:
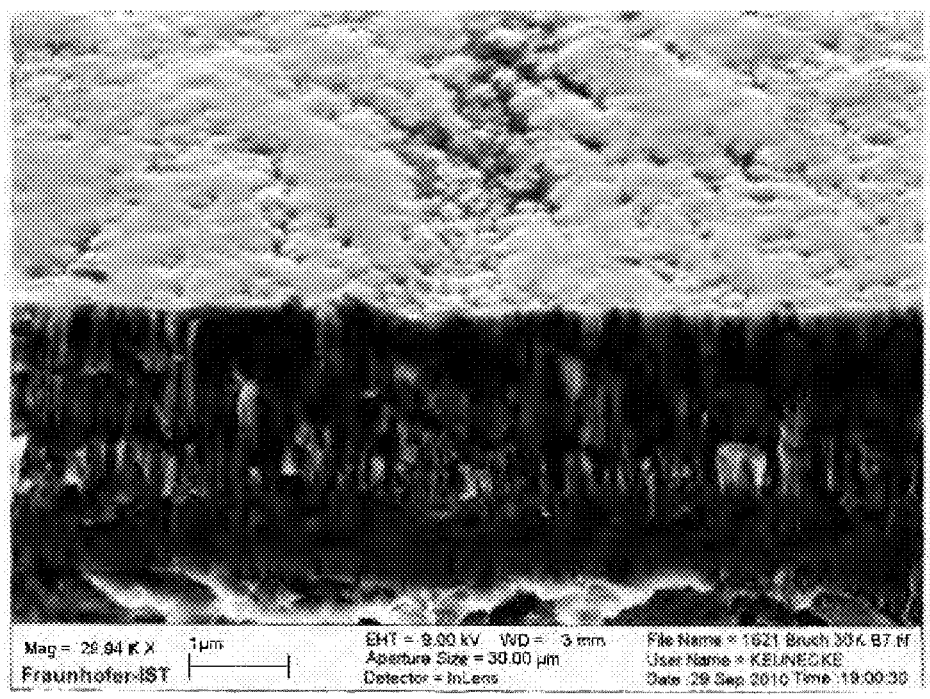
Figure 3C:
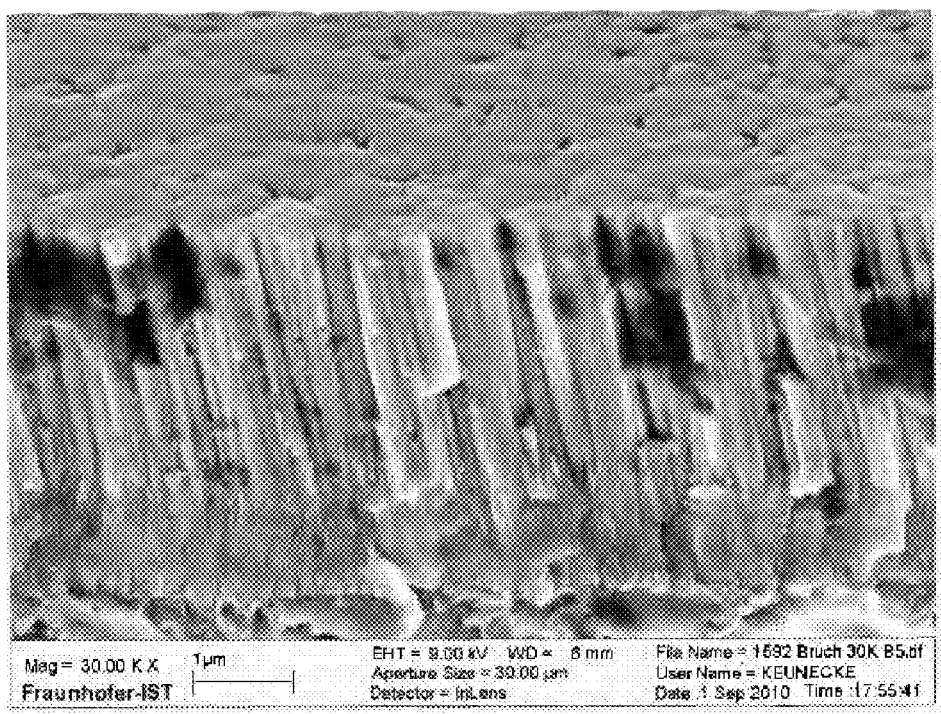
Figure 3D:
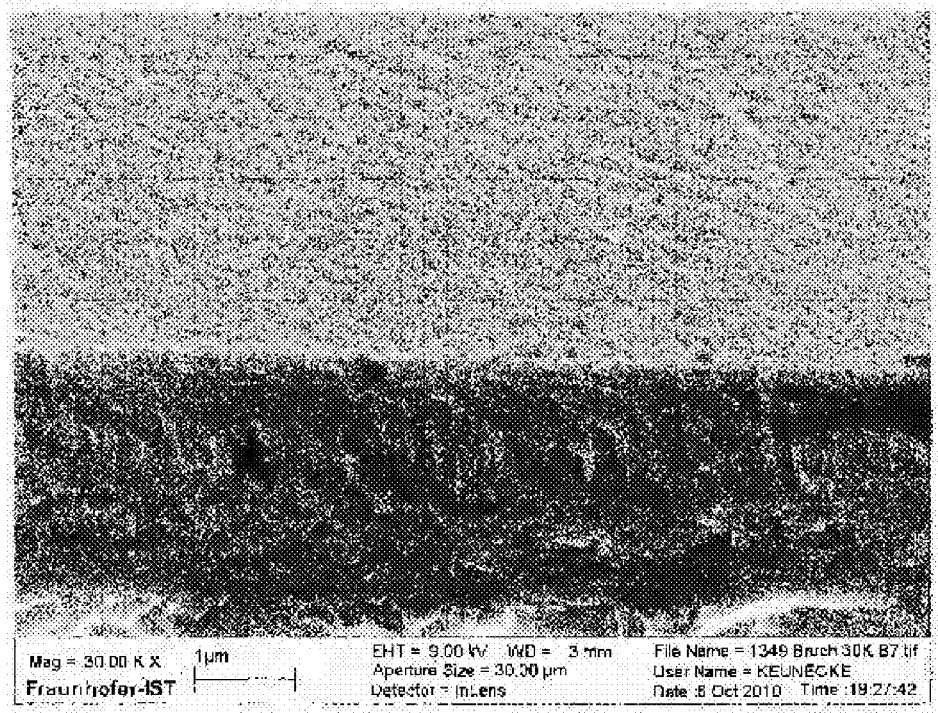

Beside the coating composition it was possible to influence the mechanical and tribological coating properties as well as the coating morphology by adjusting the deposition process parameters, e.g. the $C_2H_2$ flow. Cross sectional SEM images of Cr—C/a-C:H coatings having different compositions are shown in FIGS. 3a-d. The morphology is dominated by a columnar structure. With a Cr:C ratio 25% the cross section has the typical appearance of an a-C:H:Me coating with a "cauliflower" surface topography (FIG. 3a). By increasing the Cr content up to a Cr:C ratio of ca. 50% and furthermore 70 at %, the morphology becomes more dense and the surface gets smoother (FIGS. 3b and 3c). Suitable process parameters allow the adjustment of the morphology as well as of the mechanical properties. FIG. 3d gives an example of a Cr—C/a-C:H coating with a comparable composition (Cr:C ratio of ca. 50%) which was obtained in a completely different range of deposition process parameters. The SEM cross section image of this coating shows the changed morphology with a more fine-grained and denser structure; in addition the surface topography is significantly changed. The change in morphology of the coating is accompanied by an increase of hardness and elastic indentation modulus: $H_{IT}$=21.3 GPa/EIT=225 GPa.

For the investigations presented herein a range of Cr—C/a-C:H coatings was chosen whose mechanical properties are comparable to the already industrially well-established metal-comprising DLC coatings (a-C:H:Me), i.e. a hardness range $H_{IT}$ 10-15 GPa.

Tribological Properties and Interaction with Oil Additives:

Beside the properties which are imminent to the coating material itself, the behavior of a coating in a tribological system, including the substrate material, the lubricant and the counterpart is of major interest. To create results which are representative for an automotive application, e. g. in the powertrain, 100Cr6 was used as counterpart material for the coated surfaces in a lubricated tribotest.

The tribological tests were carried out with three different types of Cr—C/a-C:H with a significantly different behavior. The Cr content was low, middle and high with Cr:C ratios of approximately 25%, 50% and 70% determined by EPMA analysis, covering the hardness range of $H_{IT}$ 10-15 GPa. A pure DLC (a-C:H) coating was used as reference.

Figure 4A:
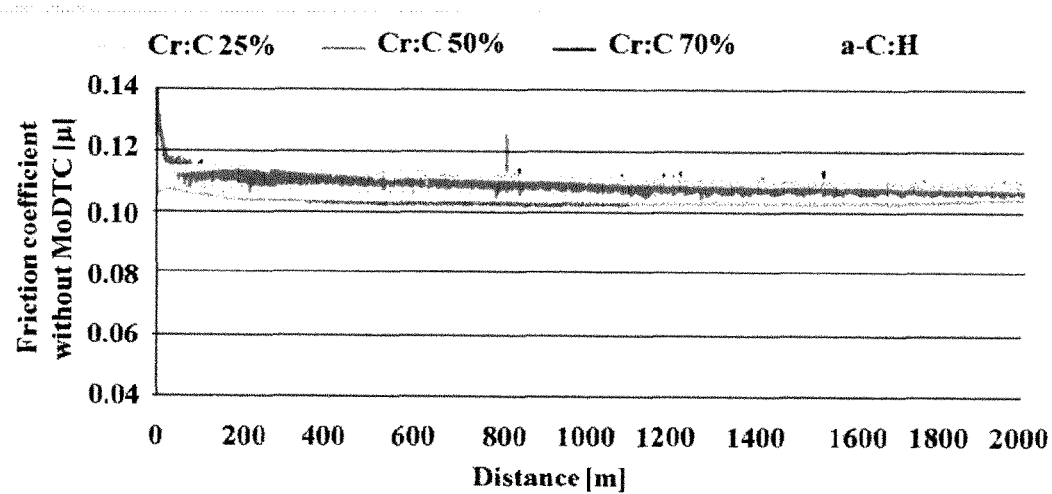

FIG. 4a shows the friction curves obtained for sample coatings under lubrication with a standard engine oil. The oil had a standard additive package without MoDTC. The friction coefficient of all coatings is in the range of 0.11 and stable over the whole sliding distance. Running-in is rather fast, and the friction curves have a rather smooth shape. One should notice that all Cr—C/a-C:H coatings show nearly the same friction behavior under these conditions. The performance is comparable to the a-C:H reference coating, which has a much higher hardness and wear resistance.

Figure 4B:
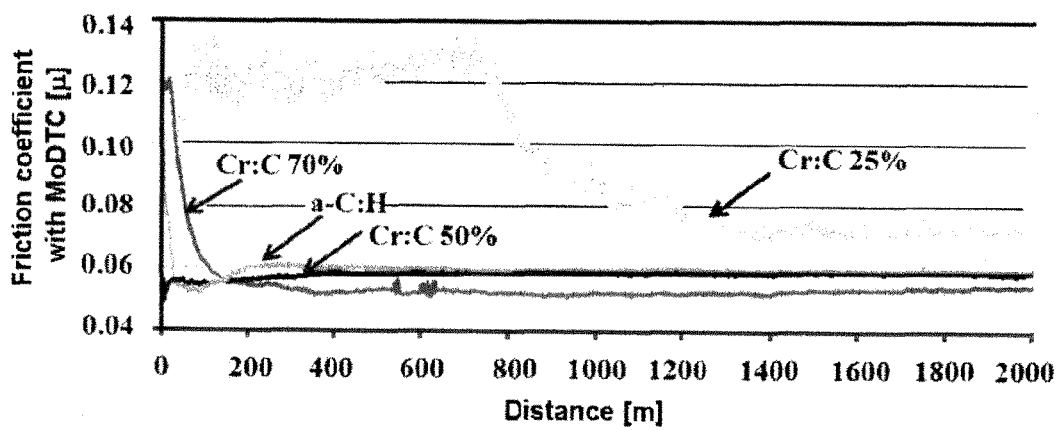

For the following tests the same engine oil but containing additionally MoDTC additive was used. Under these conditions the friction behavior is different; as shown in FIG. 4b.

The Cr—C/a-C:H coating with Cr content corresponding to a Cr:C ratio of approximately 25% has a significantly prolonged running-in phase. The friction coefficient stays for a long time at an elevated level before dropping down to a lower, but still relatively high value. In addition the whole friction curve is rough in comparison to the other coatings. One possible explanation for this behavior is a severe wear of the coating, as demonstrated later.

The friction coefficient curves of the Cr—C/a-C:H coating with Cr:C ratio of approximately 50% and the a-C:H coating are quite similar. After a short running-in phase (<50 m) a smooth friction coefficient at a low level is reached. The fast drop to a low friction level at the start of the test could be explained by a smoothening effect of coating asperities.

The Cr—C/a-C:H coating with a Cr:C ratio of approximately 70% has a slightly longer running-in phase (about 200 m), resulting in a lower friction coefficient. The friction curve shows some "spikes". These "spikes" could indicate onset of significant wear respectively deformation of the coating. In this case the interlayer or/and the metal substrate material would be exposed. After this the additives which are optimized for metal surfaces would start to dominate the friction behavior.

Figure 5A:
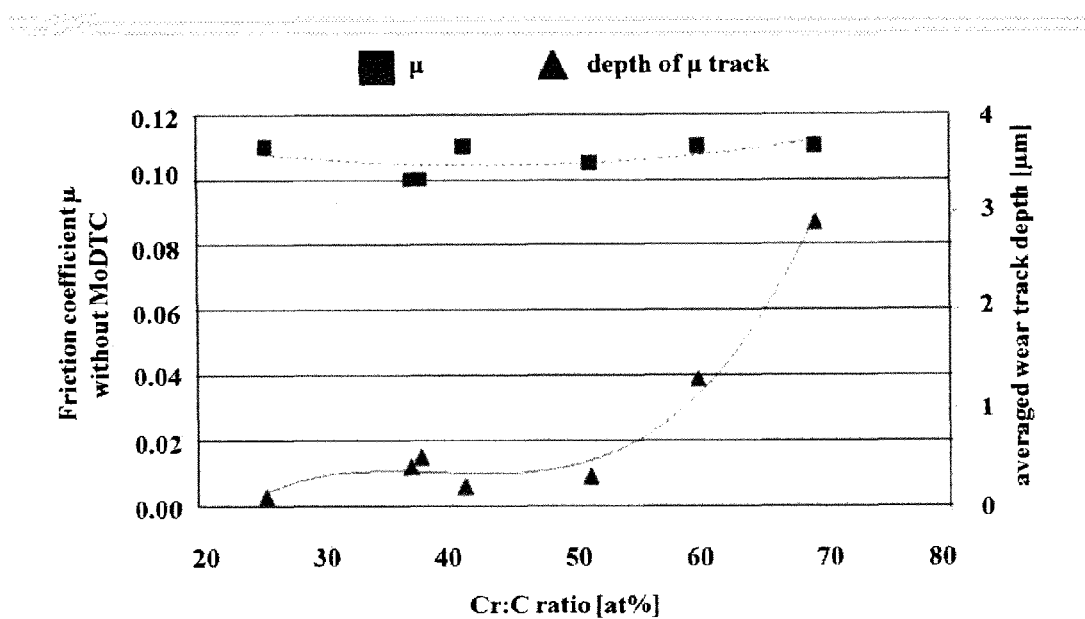
Figure 5B:
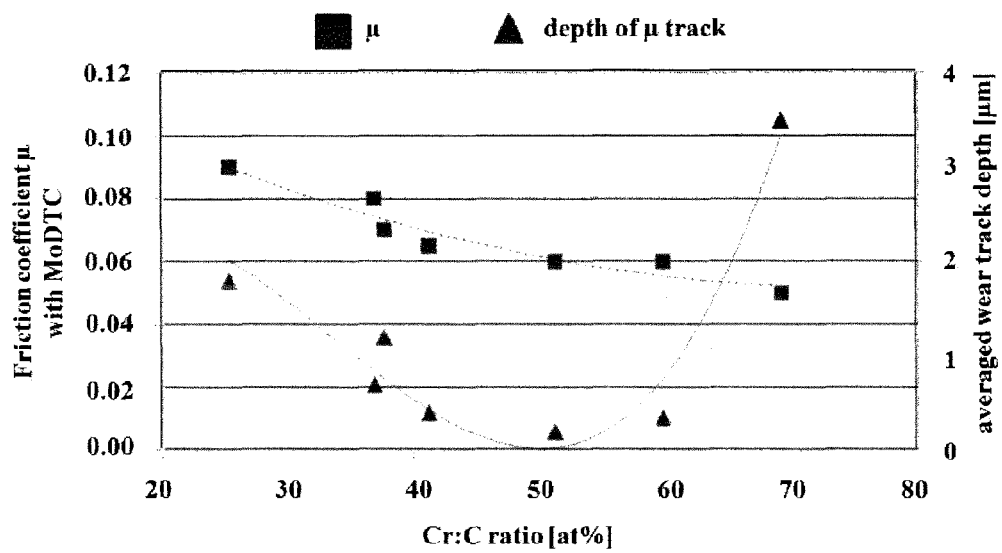

Besides the friction coefficient itself the wear track in combination with a possible deformation of the substrate material and coating surface is essential for an evaluation of the tribological performance of a coating under high load lubricated wear tests. In a first step the depth of the friction respectively wear track was analyzed. FIG. 5 shows the wear track depth, and the friction coefficient of Cr—C/a-C:H coatings with different Cr content. The wear track depth is the averaged result of a tactile stylus profiler measurement. FIGS. 5a and 5b show the results for the oil without and with MoDTC respectively.

The friction coefficients for oil without MoDTC are nearly independent of the Cr—C/a-C:H coating compositions. The depth of the wear track is low for Cr contents corresponding to Cr:C ratios of up to about 55%. At higher Cr contents the depth of the wear track increases. The low friction coefficient at a Cr content corresponding to a Cr:C ratio of 25% is in the range of conventional a-C:H:Me coatings having Cr contents corresponding to Cr:C ratios of not more than 20%. Those conventional a-C:H:Me coatings are designed to provide good functionality for the use under lubricated conditions with standard oils, but also under dry conditions in tribological contacts. Under such conditions the a-C:H:Me coatings are a feasible and suitable solution as a friction and wear reduction coating for a wide range of applications.

The results are significantly different when an engine oil containing MoDTC is used; as can be seen in FIG. 5b. The friction coefficients continuously decrease with increasing Cr content in the coatings, but the averaged wear track depth shows a pronounced minimum for Cr contents corresponding to Cr:C ratios of about 40 up to 60%.

Wear Track In-Depth Analysis:

To identify the mechanism which leads to this behavior, a detailed investigation of the wear tracks has been carried out using 3D laser microscope and SEM as well as EDX mappings. EDX mappings can be used to prove the effect of additives with a known composition. The results are summarized in FIGS. 6 and 7.

Figure 6:
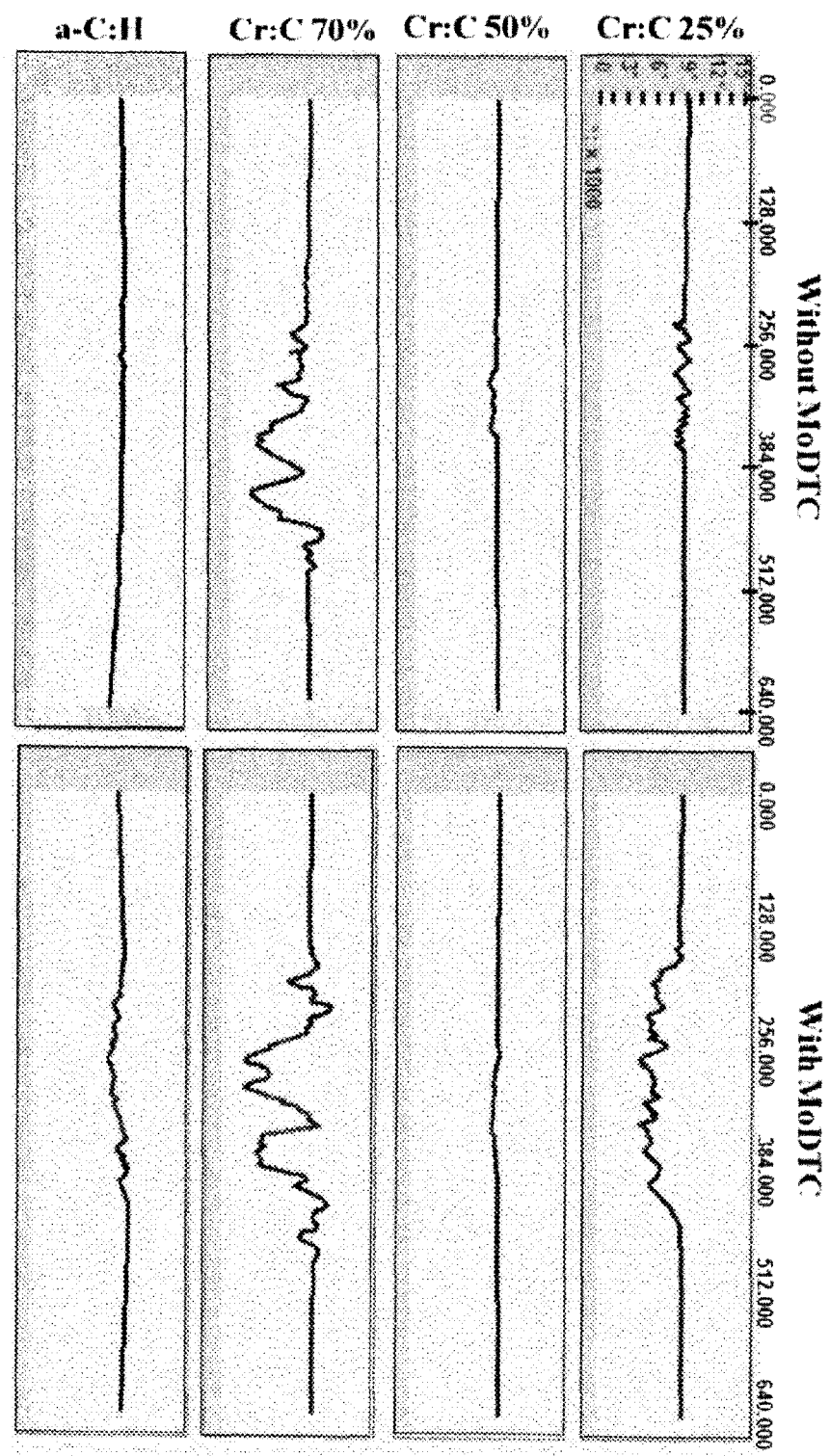

FIG. 7a shows the wear tracks of the three different Cr—C/a-C:H coatings with Cr:C ratios of approximately 25%, 50 at % and 70 at % obtained without MoDTC. The laser microscope profiles of the wear tracks (FIG. 6) prove a smooth track and only small grooves for coating compositions corresponding to Cr—C ratios of 25% and 50%. The EDX mappings show no significant differences of the coating surface between wear track and unloaded coating areas. For the Cr—C/a-C:H coating having a Cr:C ratio of 70% deep groves and trenches could be observed in the wear track with both laser microscope profile as well as SEM imaging.

FIG. 6 (on the right side) and 7b shows the resulted wear tracks profiles and images after tests carried out with coatings having the same three coating compositions but using oil with MoDTC additives. Laser microscope profile of the coatings having a Cr—C ratio of approximately 25% shows a significant trench over the whole wear track. The SEM and EDX images prove a severe wear of the coating and an exposure of the metal interlayer showing the insufficient wear resistance of the coating under these test conditions.

Molybdenum could only be detected along the wear track which translates the interaction of the additive with the exposed metallic interlayer in the high loaded coating areas. However, no interaction between additive and coatings surface was detected in the unloaded coating areas.

The laser microscope profile of the Cr—C/a-C:H coating with Cr:C ratio of approximately 50% shows nearly no difference between the loaded and unloaded area, this means nearly no detectable or observable wear track could be noted. The EDX mapping images show a dense distribution of Mo over the whole loaded area. This is an indication that the intended effect of additives, especially MoDTC, also works on the homogeneous loaded area. The combined effect of the friction reduction properties of the coating itself and the interaction with the additives results in a rather low friction coefficient. In addition it can be assumed that this low friction is rather homogenous over the whole surface. In other words, there are no localized areas of higher friction which could initialize a local damage either by a locally increased temperature or a distortion of the material due to local overload. This would be an explanation for the excellent tribological behavior of Cr—C/a-C:H coatings with a Cr content corresponding to a Cr:C ratio of about 50% when they are used under high load and with lubricants that contain Molybdenum-additives.

The Cr—C/a-C:H coating with Cr content corresponding to a Cr:C ratio of 70% shows deep grooves and severe coating wear. Along the deep grooves correlated with the exposure of metallic surfaces the deposition of additives could be detected. But the poor wear resistance of the coating and the deep grooves in high loaded contacts limit the application of this coating despite the low friction coefficient.

Figure 8:
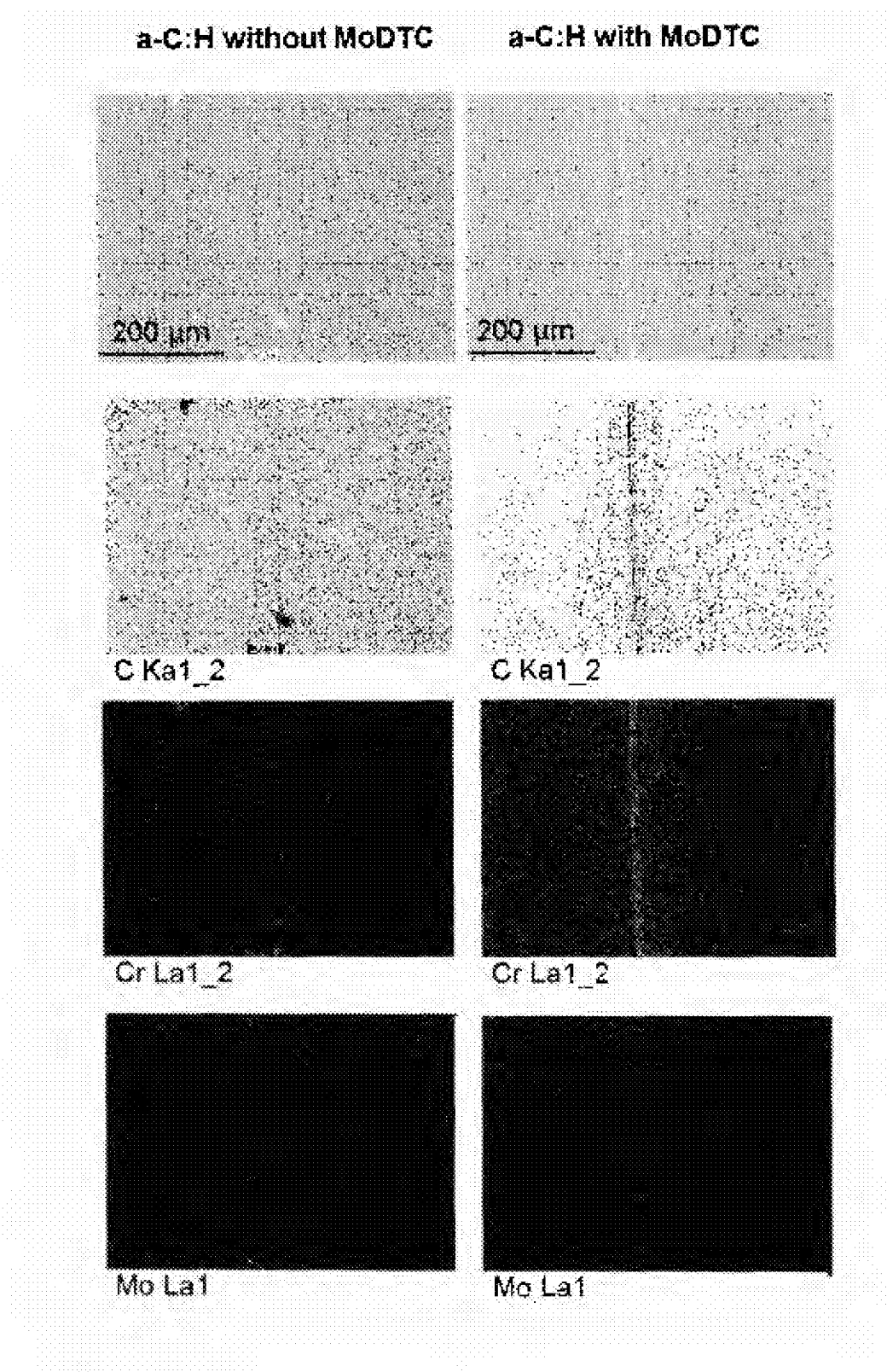

For comparison also a-C:H coatings were tested using oils without and with MoDTC additives as a reference; the results are summarized in FIG. 8. As expected, nearly no wear is observed when tested without MoDTC and only few grooves are present in the wear track profile. Also the SEM and EDX investigations give no hint for a significant wear. EDX mappings show that there is no indication for any surface activity of additives and therefore for any formation of a tribo-film generated by the interaction between coated surface and additive. When tested with MoDTC, the laser microscope profiles as well as the SEM respectively EDX images show the generation of grooves and wear. The wear of the a-C:H results in deep groves which reach partly even the metallic interlayer. In contrast to the findings for the Cr—C/a-C:H coatings there is no indication of the build-up of a tribo-film in or near these grooves. No Molybdenum as indication for the activity of the MoDTC additive could be found on the carbon surface, especially in areas without high load.

Figure 9A:
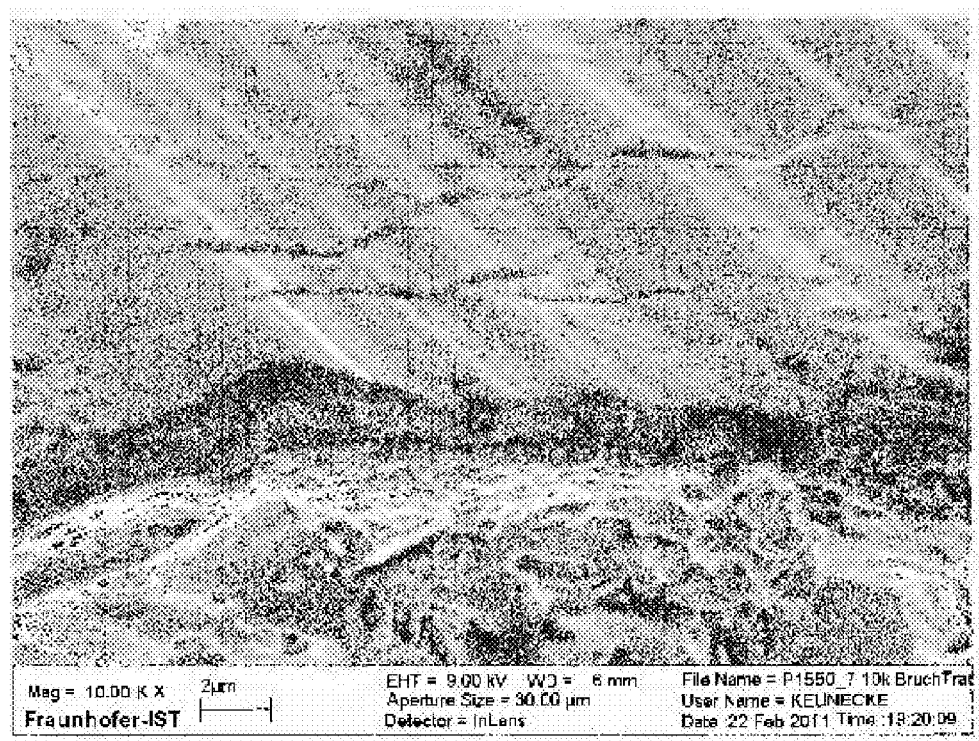
Figure 9B:
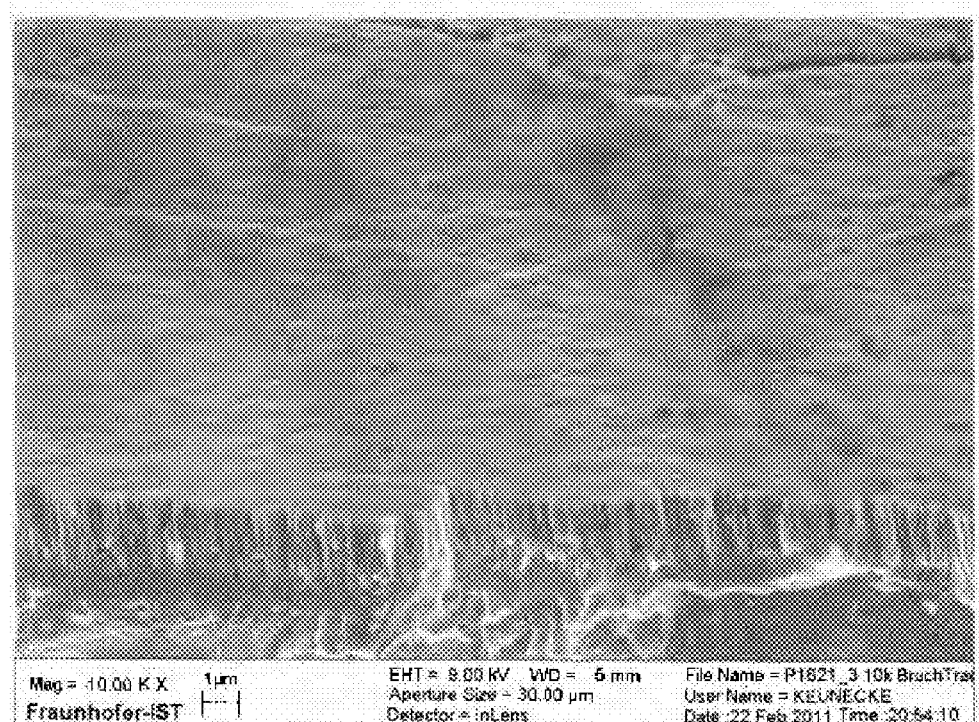

Wear track depth measurements and laser microscope profiles cannot distinguish between wear and deformation. Therefore cross sections of the wear tracks were prepared and investigated by SEM, as can be seen in FIG. 9. For the Cr—C/a-C:H coating with Cr:C ratio of 25% a significant formation of grooves, partly wear and plastically deformation of the steel substrate due to a locally overload could be confirmed (FIG. 9a). However, it is remarkable that the coating can follow the deformation of the substrate material, therefore being an indication for the high coating quality and good adhesion of the coating.

Figure 9C:
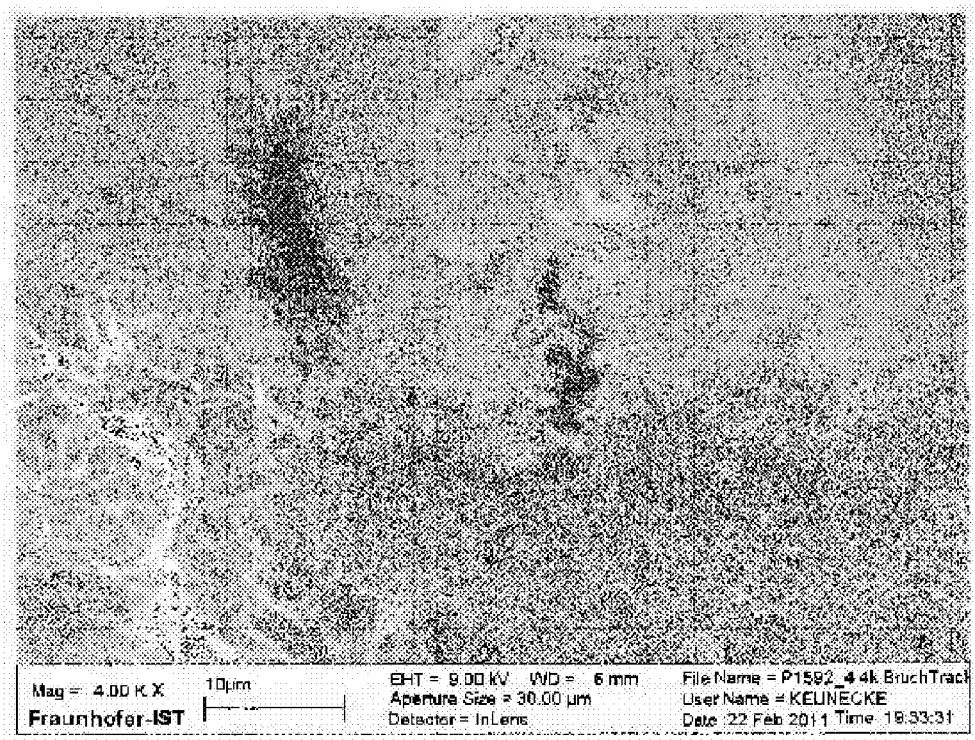

For the Cr—C/a-C:H with Cr:C ratio of 70% a deformation of the substrate and a severe damage of the coating can be observed (FIG. 9c). Furthermore, in contrast to the Cr—C/a-C:H coating with Cr:C ratio of 25%, the Cr Cr—C/ a-C:H coating with Cr:C ratio of 70% seems to be deformed, broken and nearly pulverized. This is in good agreement with the more scattered EDX images of the wear track of this sample compared to the Cr—C/a-C:H with Cr:C of 25%.

The Cr—C/a-C:H coating with Cr:C ratio of 50% (FIG. 9b) shows a totally different behavior. The wear track is difficult to distinguish from the unloaded area, no wear or deformation of the substrate material is visible even in the highly loaded area. Only smoothening of the coating and only small grooves could be detected.

FIG. 10 shows the SEM cross section image of a-C:H coating wear track after a lubricated friction test with MoDTC additives. A great number of distinguishable grooves could be detected in the wear track. It is obvious that there is no deformation of substrate material responsible for the creation of the grooves but an decrease of the a-C:H coating thickness. This is taken as a clear prove for the wear of the a-C:H coating under lubricated condition with MoDTC additives.

The detailed analysis of the wear track using 3D profiles, cross sections and SEM/EDX revealed, that under high loads of about 2 GPa or even more not only wear of the coating but also deformation of the underlying substrate material can occur. For Cr—C/a-C:H coatings with Cr:C of approximately 50 at % the combined effect of the wear resistant and friction reducing coating itself and the additional interaction between coating and additives guarantees homogenous and low friction compared with excellent wear resistance. The system can withstand high loads without deformation and wear. Changing the composition of the coating means also a change of the wear mechanisms under high load in a lubricated system.

Cr—C/a-C:H coatings with different compositions were synthesized successfully by sputtering chromium targets in a mixed Ar/$C_2H_2$ atmosphere. A large range of Cr:C ratios could be adjusted. A detailed investigation of the mechanical and tribological properties of the coatings revealed that Cr—C/a-C:H coatings show excellent performance in high loaded tribological contacts under lubrication with a standard engine oil. When using an engine oil without MoDTC additives, the performance of the Cr—C/a-C:H coatings is comparable to that of well-established a-C:H coatings, regardless of the Cr content in the coatings. When testing the coatings in an engine oil containing MoDTC additives, Cr—C/a-C:H coatings with a Cr content >50 at % show a similar coefficient of friction than a-C:H coatings. However, the wear resistance of Cr—C/a-C:H coatings with Cr:C of approximately 50 at % Cr was superior to that of a-C:H coatings. The higher coating hardness of a-C:H coatings gives no benefit, since the observed wear seems to be most probably the result of tribochemical mechanisms between the coated surface and oil additives. In the present case, the better performance of Cr—C/a-C:H coatings, especially at a Cr content corresponding to a Cr:C ratio of about 50 at %, can be attributed to a positive chemical and mechanical interaction between the Cr—C/a-C:H coating surface and the Molybdenum-comprising additive.

All coatings described as examples according to the present invention were carried out in a small commercial coating machine (Oerlikon Balzers BAI830DLC) with a maximum coating height of 380 mm. We also transferred the Cr—C/a-C:H coating processes to a commercial high-volume coating machine or mid-volume coating machine (Oerlikon Balzers RS90 or OB RS50) with a maximum coating height of 850 mm. On all coating machines, the deposition process for Cr—C/a-C:H coatings is stable and the coating properties (composition, mechanical and tribological properties) are reproducible. Coating height in this context means the dimension corresponding to the length in the vertical axis of the coating machine along it the substrates to be coated are distributed and the maximum coating height corresponds to the longest coating height by which the deposition of a homogenous coating on the substrates to be coated can be assured (regarding coating quality as well as thickness).

Figure 11:
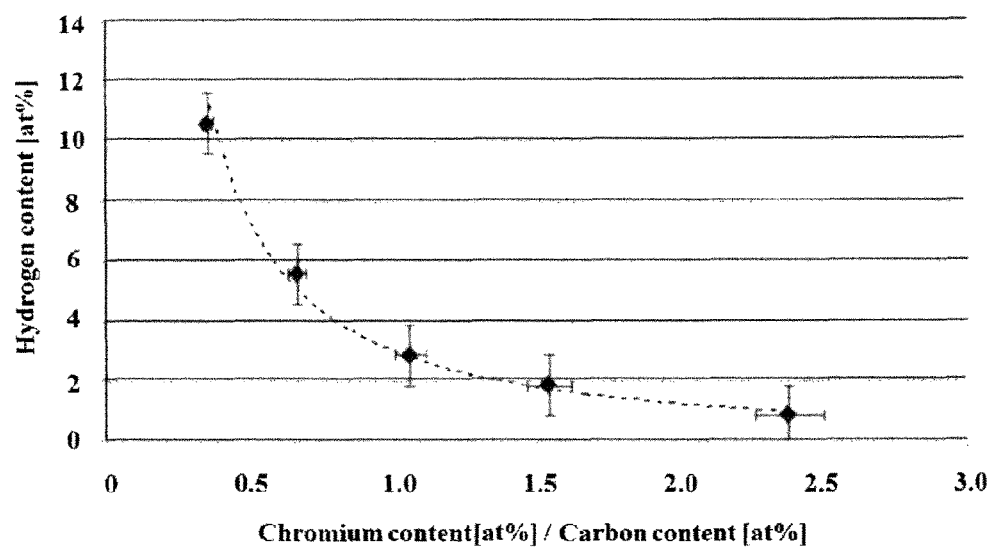
Figure 12:
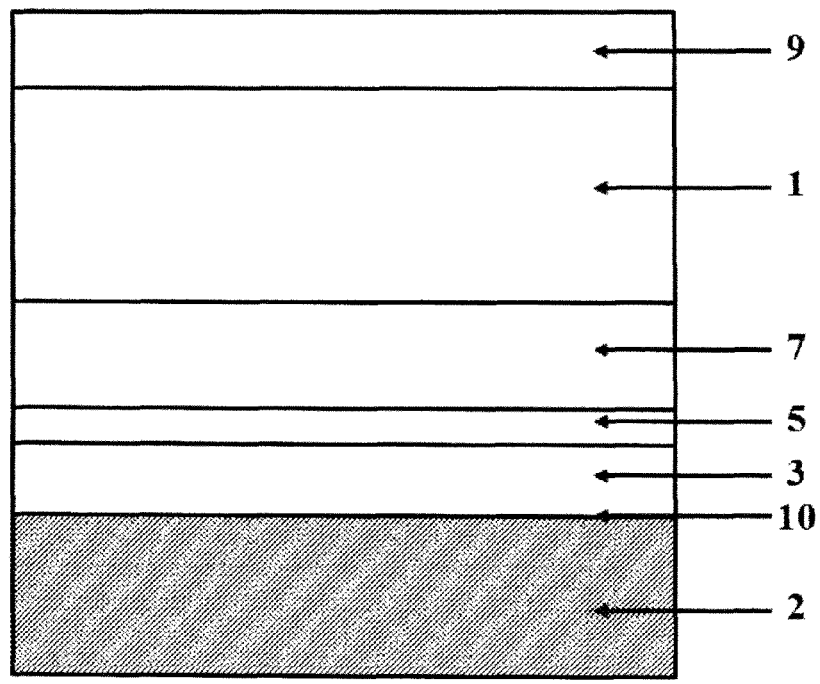

For the results that are shown in FIG. 11 the respectively Cr:C ratios of the functional layers Cr—C/a-C:H were determined by EPMA analysis and the hydrogen contents were measured by secondary ion mass spectrometry (SIMS) examinations. Secondary ion mass spectrometry is a technique used in materials science and surface science to analyze the composition of solid surfaces and thin films by sputtering the surface of the specimen with a focused primary ion beam and collecting and analyzing ejected secondary ions. These secondary ions are measured with a mass spectrometer to determine the elemental, isotopic, or molecular composition of the surface. According to the results displayed in FIG. 11 the hydrogen content decreases by increasing chromium content, however at a Cr:C ratio of about 1 there is still a significant H-content (about 3 at %) detectable.

Example 2

Cr—C/a-C:X Coatings with X=H+Si

Coating Deposition: The Cr—C/a-C:X coatings with X=H+Si and having different Cr:C ratios were prepared in a similar way that the Cr—C/a-C:H coatings in example 1 but using Tetramethylsilan (TMS) or a mixture of TMS and $C_2H_2$ gases for the deposition of the carbon containing layers of the coatings. For the coating preparation a commercial PVD/PACVD-system (Oerlikon Balzers BAI830DLC) with a residual pressure in the range of $2.0 \cdot 10^{-5}$ mbar or below was used.

Prior to deposition, the steel substrates (DIN 1.2842, Ø 22 mm×5.6 mm) were heated to approximately 150° C. and etched in a pure Ar plasma with ions extracted from an additional arc discharge (low voltage arc). After etching, a pure Cr layer (adhesion layer 3) was deposited by means of dc-sputtering from two Cr-targets in a pure Ar atmosphere in order to assure a good adherence between the following coating and the steel substrate. In addition, prior to the Cr—C/a-C:(Si+H) coating (function layer 1) a $Cr_xN_y$ layer (support layer 5) was deposited from two Cr-targets in a mixed Ar/$N_2$ atmosphere in order to increase the load capacity for the following Cr—C/a-C:(Si+H) coating (function layer 1).

In some cases also a gradient layer comprising essentially Cr—N—C (transition layer 7) having variable nitrogen and carbon content along its thickness was deposited between the Cr—N and the Cr—C/a-C:(H+Si) layer by simultaneously reducing of the nitrogen flow and increasing of the $C_2H_2$— or TMS-flow or mixture of $C_2H_2$— and TMS flows in the coating chamber in order to increase the bonding strength within the coating system.

The Cr—C/a-C:(H+Si) coatings were then deposited by means of dc-sputtering from two Cr-targets in a mixed Ar/TMS or Ar/TMS+$C_2H_2$ atmosphere in a pressure range of $4.0-4.5 \cdot 10^{-3}$ mbar. During deposition, the target power was kept constant at 7.5 kW per target, the bias voltage (applied with a d.c. pulse power supply) was adjusted to −800 V and the Ar flow was set to 115 sccm. The Cr:C-ratio was then adjusted by simply varying the $C_2H_2$ flow between 142 sccm (for the lowest Cr content) and 57 sccm (for the highest Cr content). The coating thickness was commonly adjusted to about 2 μm and the process temperature was below 230° C.

The Cr content in the Cr—C/a-C:(H+Si) coatings varies nearly linearly with the TMS or TMS+$C_2H_2$ flow. For the investigated flow ranges, the Cr content was adjusted to obtain coatings with Cr:C ratios of between ~25% (for the highest TMS or TMS+$C_2H_2$ flow) and ~70% (for the lowest TMS or TMS+$C_2H_2$ flow).

In some cases after the deposition of the Cr—C/a-C:(H+Si) coating (function layer 1) a further layer or top layer having run-in properties (run-in layer 9) was deposited.

Preferably the run in layer is a Cr—C/a-C:(H+Si) layer having a Cr:C ratio of 25% or a standard a-C:H layer having run-in properties.

For comparison, the same steel samples were also coated with commercially available metal-free DLC coating (a-C:H) with a coating thickness of about 2-3 μm. The a-C:H coating was performed in m.f. glow discharge process in a mixed Ar/$C_2H_2$ atmosphere with an approximately 0.5 μm thick sputtered Cr layer as adhesion layer.

The Cr—C/a-C:(H+Si) coatings deposited according to the present invention as described above and having Cr:C ratios of between and including 30 and 60% showed better interaction with Mo- and Zn-comprising oil additives in comparison with the comparative metal-free a-C:H coating resulting in better friction and wear behavior in tribological application tests.

Preferred Embodiments of the Present Invention

A preferred embodiment of the present invention is a sliding component for use with a Molybdenum and/or Zinc comprising lubricant, wherein the component comprises a coating foreseen to be at least partially in contact with the lubricant, the coating comprising at least one Me-C/a-C:X layer that is formed by a composition which can be expressed as $(Me_aC_{1-a})_{1-b}X_b$ with 0.3=<a=<0.6 and 0<b=<0.3 where Me is a metal or a mixture of two or more metals, C is carbon and

X is an element different from Me and different from C, or X is a mixture of elements different from Me and different from a mixture of elements that contain C.

a is the atomic fraction of Me if only Me and C are considered for the element balance, and b is the atomic fraction of X if Me, C and X are considered for the element balance.

In a further preferred embodiment of the present invention in the at least one Me-C/a-C:X layer comprised in the coating of the sliding component mentioned above, Me is chromium or molybdenum or is a mixture of two or more metals that contains mostly chromium or molybdenum, and X is hydrogen (H) or silicon (Si) or nitrogen (N) or boron (B), or X is a mixture of elements that contains mostly hydrogen or silicon or nitrogen or boron.

In one more further preferred embodiment of the present invention the at least one Me-C/a-C:X layer comprised in the coating of the sliding component mentioned above is a function layer (1).

In one more further preferred embodiment of the present invention the coating of the sliding component mentioned above comprises in addition to the function layer (I) also at least one adhesion layer (3) and/or at least one support layer (5) and/or at least one transition layer (7) and/or at least one run-in layer (9), wherein if given, the at least one adhesion layer (3) is deposited on the substrate surface to be coated (10), between the substrate surface to be coated (10) and the function layer (1), if given, the at least one support layer (5) is deposited under the function layer (1), between the substrate surface to be coated (10) and the function layer (1) or between the at least one adhesion layer (3) and the function layer (1), if given, the at least one transition layer (7) is deposited under the function layer (1), between the at least one adhesion layer (3) and the function layer (1) or between the at least one support layer (5) and the function layer, if given, the at least one run-in layer (9) is deposited above the function layer (1).

In one more further preferred embodiment of the present invention the coating of the sliding component mentioned above which in addition to the function layer (1) also comprises at least one adhesion layer (3) and/or at least one support layer (5) and/or at least one transition layer (7) and/or at least one run-in layer (9) is characterized by:

the function layer (1) has element composition $(Cr_aC_{1-a})_{1-b}X_b$ with a in the range 0.3≤a≤0.6, preferably 0.4≤a≤0.5, more preferably a=0.45, and b in the range 0<a≤0.3, preferably 1≤a≤0.2, more preferably if Me is chromium and X is hydrogen then 2≤a≤0.12, this function layer (1), and if given, the at least one adhesion layer (3) is essentially a metallic layer consisting of one or more metals, preferably consisting of chromium, this at least one adhesion layer (3) having preferably a thickness lower than 1 μm, and/or if given, the at least one support layer (5) is essentially a metal nitride layer, preferably essentially consisting of chromium nitride, this at least one support layer (5), and/or if given, the at least one transition layer (7) is mostly a metal-carbon-nitrogen layer that can comprise also the elements Me and X contained in the function layer and which is a gradient layer with variable concentration of the elements along the layer thickness characterized in particular by lower carbon concentration near to the support layer (5) and higher carbon concentration near to the function layer (1), and/or if given, the at least one run-in layer (9) is a a-C:H layer or Me-C/a-C:H layer which is formed by a composition which can be expressed as $(Me'_aC_{1-a})_{1-b}X'_b$ with a=0.25, where Me' is the same element or mixture of elements that Me in the function layer (1), C is carbon, X' is the same element or mixture of elements that X in the function layer (1), a is the atomic fraction of Me' if only Me' and C are considered for the element balance, and b is the atomic fraction of X' if Me', C and X' are considered for the element balance.

In one more further preferred embodiment of the present invention the coating of the sliding component mentioned above which in addition to the function layer (1) also comprises at least one adhesion layer (3) and/or at least one support layer (5) and/or at least one transition layer (7) and/or at least one run-in layer (9) is characterized by the function layer (1) has a thickness between 0.5 and 30 μm depending on the application.

the at least one adhesion layer (3) has a thickness lower than 1 μm, preferably of 0.3 μm.

the at least one support layer (5) has a thickness lower than 3 µm, preferably of about 1.5 µm.

the at least one transition layer (7) has a thickness lower than 1 µm, preferably of about 0.3 µm.

the at least one run-in layer (9) has a thickness of maximal 1 µm, preferably between 0.2 and 0.5 µm.

As it was mentioned above the coating thickness to be used must be chosen depending on the application. For example coating thickness, particularly functional layer coating thickness of up to 30 µm can be recommended for coating piston rings and up to 10 µm for coating tribological engine parts.

A further embodiment of the present invention concerns to a tribological system comprising a sliding component according to one of above described embodiments of the present invention and a Molybdenum and/or Zinc-comprising lubricant.

The present inventions relates also to the use of a sliding component according to one of the above described embodiments of the present invention for highly loaded applications by lubricated conditions.

What is claimed is:

1. A sliding component for tribological contact under lubricated conditions, the sliding component comprising a coating at least partially in contact with a fluid lubricant, the coating being a metal doping modified DLC coating and comprising one or more function layers having an element composition of $(Me_aC_{1-a})_{1-b}X_b$, $0.3=<a=<0.6$, $0<b=<0.3$, a being the atomic fraction of Me if only Me and C are considered for the element composition, b being the atomic fraction of X if Me, C, and X are considered for the element composition, Me consisting of materials selected from the group consisting of chromium, molybdenum, and a mixture of two or more metals consisting essentially of one of chromium and molybdenum, C being carbon, X consisting of materials selected from the group consisting of hydrogen, silicon, nitrogen, boron, and a mixture of elements consisting essentially of one or more of the group consisting of hydrogen, silicon, nitrogen, and boron, the fluid lubricant comprising one of molybdenum, zinc, and a combination thereof, wherein Me:C ratio ranges from about 40% up to about 60%.

2. The sliding component according to claim 1, wherein Me consists of chromium and X consists of hydrogen.

3. The sliding component according to claim 1, wherein Me consists of chromium and X consists of a mixture of hydrogen and silicon.

4. The sliding component according to claim 1, wherein a is about 0.45.

5. The sliding component according to claim 4, wherein Me consists of chromium and X consists of hydrogen.

6. The sliding component according to claim 1, wherein the coating further comprises one or more layers selected from the group consisting of one or more adhesion layers, one or more support layers, one or more transition layers, and one or more run-in layers, wherein, if the coating comprises the adhesion layers, the adhesion layers are deposited on a substrate surface to be coated between the substrate surface to be coated and the function layers, wherein, if the coating comprises the support layers and the adhesion layers, the support layers are deposited under the function layers and one of between the substrate surface to be coated and the function layers and between the adhesion layers and the function layers, wherein, if the coating comprises the transition layers, the adhesion layers, and the support layers, the transition layers are deposited under the function layers and one of between the adhesion layers and the function layers and between the support layers and the function layers, and wherein, if the coating comprises the run-in layers, the run-in layers are deposited above the function layers.

7. The sliding component according to claim 6, wherein Me consists of chromium and X consists of hydrogen.

8. The sliding component according to claim 6, wherein Me is chromium and X is a mixture of hydrogen and silicon.

9. The sliding component according to claim 6, wherein a is about 0.45.

10. The sliding component according to claim 9, wherein Me is chromium and X is hydrogen.

11. The sliding component according to claim 6, wherein Me consists of chromium, and wherein one of:
if the coating comprises the adhesion layers, one or more of the adhesion layers have a thickness that is less than 1 micron and consists essentially of a metallic layer consisting of chromium;

if the coating comprises the support layers, one or more of the support layers consists essentially of chromium nitride;

if the coating comprises the transition layers and the support layers, each of the transition layers consists essentially a metal-carbon-nitrogen layer comprising Me and X, the metal-carbon-nitrogen layer being a gradient layer having a variable concentration of elements along a thickness of the gradient layer, the carbon concentration of the gradient layer being at its lowest when near the support layers and its highest when near the functional layers;

if the coating comprises the run-in layers, each of the run-in layers consists of one of an a-C:H layer and an Me-C/a-C:H layer, the Me-C/a-C:H layer consisting essentially of Me', C, and X', the concentration of Me' and C being given by the expression $(Me'_aC_{1-a'})_{1-b}X'_b$, $a'=0.25$, Me' consisting of the materials of Me, X' consisting of the materials of X, a' being the atomic fraction of Me' if only Me' and C are considered for a balance of elements in the Me-C/a-C:H layer; and any combination thereof.

12. The sliding component according to claim 11, wherein Me consists of chromium and X consists of hydrogen.

13. The sliding component according to claim 11, wherein Me is chromium and X is a mixture of hydrogen and silicon.

14. The sliding component according to claim 11, wherein a is about 0.45.

15. The sliding component according to claim 14, wherein Me is chromium and X is hydrogen.

16. The sliding component according to claim 1, wherein the sliding component consists of a piston ring.

17. A tribological system comprising the sliding component according to claim 1.

18. The sliding component according to claim 1, wherein a=0.45.

UNITED STATES PATENT AND TRADEMARK OFFICE
CERTIFICATE OF CORRECTION

PATENT NO. : 9,528,180 B2
APPLICATION NO. : 14/002412
DATED : December 27, 2016
INVENTOR(S) : Jurgen Becker et al.

Page 1 of 1

It is certified that error appears in the above-identified patent and that said Letters Patent is hereby corrected as shown below:

In the Specification

Column 8, Line 22, replace "$H_{11}$" with -- $H_{IT}$ --.

Signed and Sealed this
Eighteenth Day of April, 2017

Michelle K. Lee
*Director of the United States Patent and Trademark Office*